United States Patent [19]

Kazama

[11] Patent Number: 5,189,364
[45] Date of Patent: Feb. 23, 1993

[54] CONTACT PROBE

[75] Inventor: Toshio Kazama, Kanagawa, Japan

[73] Assignee: NHK Spring Co., Ltd., Yokohama, Japan

[21] Appl. No.: 737,763

[22] Filed: Jul. 30, 1991

[30] Foreign Application Priority Data

Jul. 30, 1990 [JP] Japan .................................. 2-201998

[51] Int. Cl.$^5$ ............................................. G01R 1/073
[52] U.S. Cl. .................. 324/158 P; 324/72.5
[58] Field of Search ............... 324/158 P, 158 F, 72.5; 439/482

[56] References Cited

FOREIGN PATENT DOCUMENTS 2066590  7/1981  United Kingdom ............ 324/158 P

OTHER PUBLICATIONS

Bohannon, W. D.; "Twin Contact Multiple Connector"; Western Electric Technical Digest No. 22; Apr. 1971; pp. 9-10.

*Primary Examiner*—Ernest F. Karlsen
*Attorney, Agent, or Firm*—Baker & Daniels

[57] ABSTRACT

A contact probe consisting of a tubular receptacle, a needle member received in the tubular receptacle in a freely slidable manner, a compression coil spring coiled around the needle member, and compressed between a shoulder surface defined in the receptacle and another shoulder surface defined in the needle member to urge the needle member out of the front end of the tubular receptacle, and a wire coil or a sleeve member securely wrapped around the part of the needle member which can be adjacent the rear end of the receptacle over the entire stroke of the needle member. The wire coil or the sleeve member effectively reinforces the part of the needle member placed adjacent the rear end of the receptacle against bending stress without substantially reducing the flexibility of the reinforced part of the needle member, and substantially improves the durability of the contact probe for the given material and dimensions of the contact probe.

11 Claims, 6 Drawing Sheets

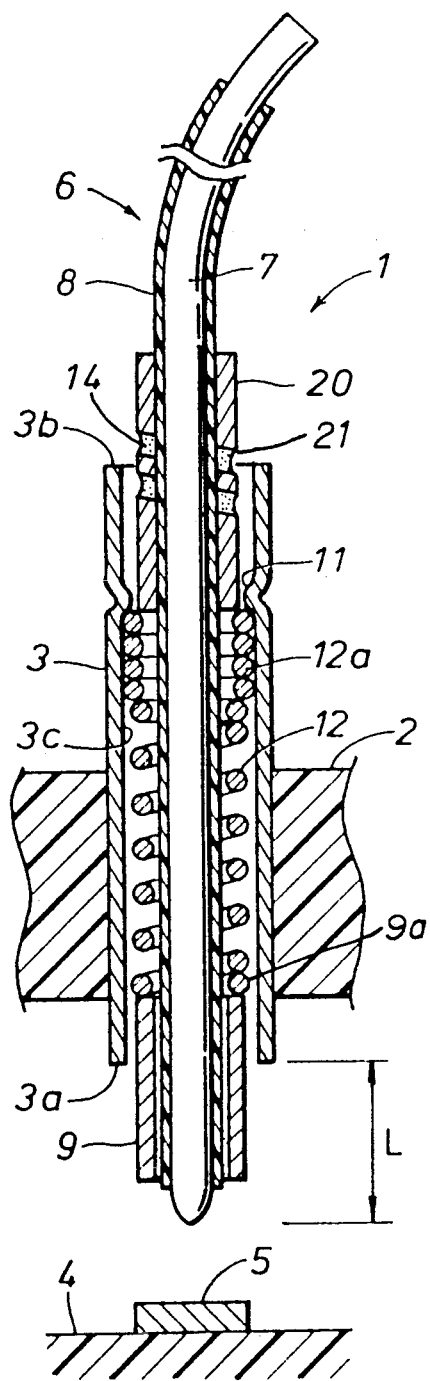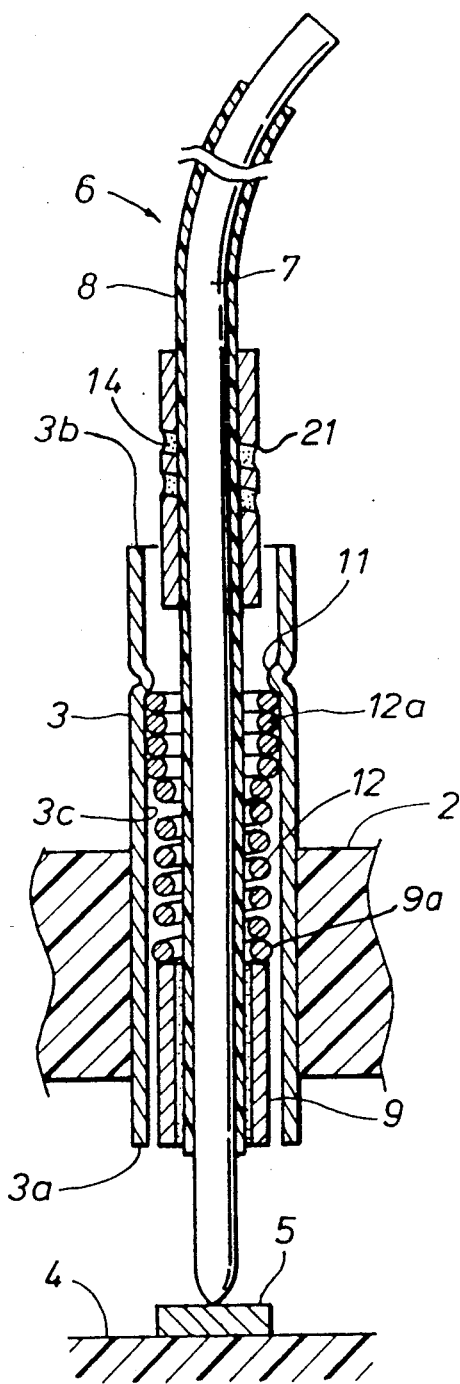
Fig. 7
Fig. 9

CONTACT PROBE

TECHNICAL FIELD

The present invention relates to a contact probe for establishing an electric contact with an object to be tested such as a printed circuit board, an integrated circuit and other electric devices for testing and monitoring purposes.

BACKGROUND OF THE INVENTION

Conventionally, the contact probe head including a number of contact probes mounted on a common base plate has been used for testing electronic devices as a part of a testing machine. Such a contact probe typically comprises a tubular receptacle, a needle member received therein, and a spring member urging the needle member out of the front end of the receptacle as disclosed in commonly assigned U.S. Pat. No. 5,004,977. The spring member typically consists of a compression coil spring, and is engaged with the receptacle at its one end and with a front end portion of the needle member at its other end. In particular, by using a needle member consisting of a continuous wire member extending from the front end to the rear end connected to the control unit of the testing machine, it is possible to achieve an extremely small electric resistance between the object to be tested and the control unit and an extremely low noise level.

Recently, the density of the wiring pattern of the printed circuit board and other electronic equipment is increased due to a general demand for compact design, and the diameter of each contact probe is accordingly desired to be reduced as much as possible. However, the reduced diameter of each contact probe means less resistance against repeated bending stress. The attention of the inventor was drawn to the fact that the bending stress tends to be concentrated in the part of the needle member situated close to the rear end of the receptacle.

BRIEF SUMMARY OF THE INVENTION

In view of such problems of the prior art, a primary object of the present invention is to provide a contact probe which allows its needle member to be reduced in diameter while assuring a sufficient mechanical strength to the needle member against bending stress.

A second object of the present invention is to provide a contact probe which is simple in structure and durable in operation.

A third object of the present invention is to provide a contact probe which is reliable in operation.

A fourth object of the present invention is to provide a contact probe which is easy to fabricate.

These and other objects of the present invention can be accomplished by providing a contact probe, comprising: a tubular receptacle having a front end and a rear end; a needle member received in the tubular receptacle in a slidable manner; a compression coil spring coiled around the needle member, and abutting a shoulder surface defined in the receptacle at one end thereof and a shoulder surface defined in the needle member at other end thereof to urge the needle member out of the front end of the tubular receptacle; means for limiting an extent of the movement of the needle member out of the front end of the tubular receptacle; and sleeve means securely wrapped around a part of the needle member which can be situated adjacent the rear end of the receptacle over an entire stroke of the needle member. The sleeve means may consist of a wire coil or a sleeve member fitted onto the needle member. For the purpose of placing a bonding agent to fixedly secure the sleeve member onto the needle member, the sleeve member may be provided with a spiral slit or a side opening.

The wire coil or the sleeve member effectively reinforces the part of the needle member placed adjacent the rear end of the receptacle against bending stress without substantially reducing the flexibility of the reinforced part of the needle member, and substantially improves the durability of the contact probe for the given material and dimensions of the contact probe.

According to a preferred embodiment of the present invention, the wire coil comprises a coarsely wound portion, a finely wound portion, preferably one on each end of the coarsely wound portion, and a bonding agent applied to the coarsely wound portion of the wire coil so that the bonding agent may be prevented from seeping out of the wire coil and adversely affecting other parts of the contact probe.

According to a structurally advantageous embodiment of the present invention, the means for limiting an extent of the movement of the needle member may consist of an end of the sleeve means adjacent the end of the compression coil spring abutting the shoulder surface defined in the receptacle so that the sleeve means may serve the dual functions of reinforcing the needle member and limiting the extent of the needle member projecting from the front end of the receptacle.

The present invention is particularly suitable for use with a contact probe in which the needle member comprises a continuous conductor extending from a front end of the needle member over at least a certain distance out of the rear end of the receptacle, and an insulating resin layer formed around the continuous conductor at least over a length thereof which can be situated inside the receptacle.

BRIEF DESCRIPTION OF THE DRAWINGS

Now the present invention is described in the following with reference to the appended drawings, in which:

FIG. 7 is a view similar to FIG. 1 showing a third embodiment of the contact probe of the present invention;

FIG. 9 is a view similar to FIG. 4 showing the third embodiment;

DETAILED DESCRIPTION OF THE PREFERRED EMBODIMENTS

Figure 1:
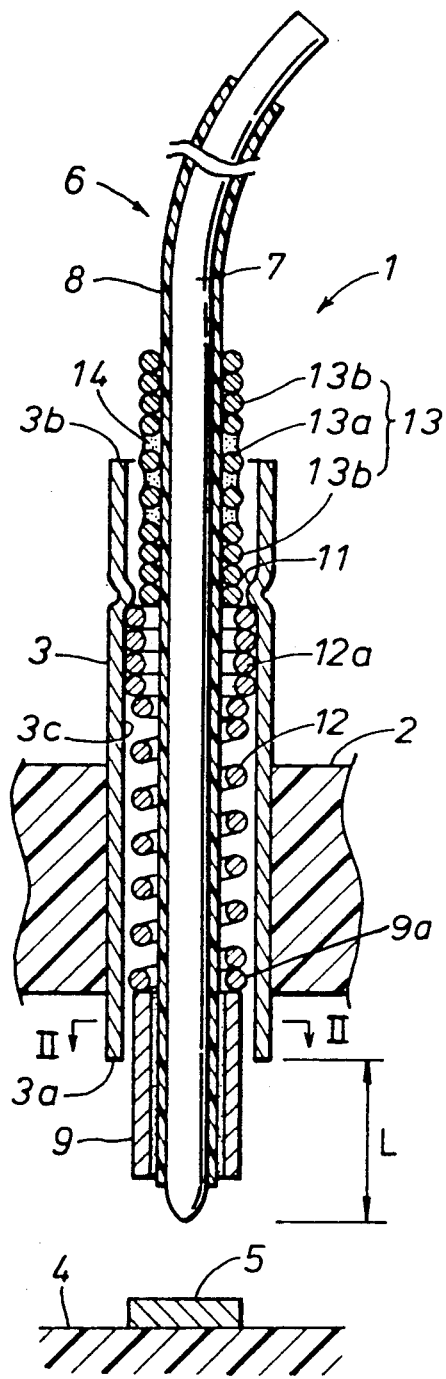
FIG. 1 is a longitudinal sectional view showing a first embodiment of the contact probe of the present invention.
Figure 2:
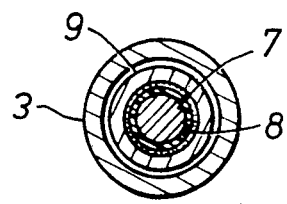
FIG. 2 is a sectional view taken along line II—II of FIG. 1.

FIG. 1 shows a preferred embodiment of the contact probe according to the present invention. This contact probe 1 comprises a tubular receptacle 3 (0.31 mm in outer diameter and 18 mm in length) which is passed through and fixedly secured to a base plate 2 of a contact probe head forming a part of an automated testing machine not shown in the drawings, and a conductive needle 6 consisting of a wire member which is slidably received in the receptacle 3 so as to be brought into contact with an object to be tested such as a printed circuit pattern 5 of a printed circuit board 4 at its front end. The conductive needle member 6 comprises a core conductor 7 consisting of an extremely fine tungsten wire which, for instance, is 0.1 mm in diameter, and an insulating resin layer 8 coated on the outer circumferential surface of the core conductor 7 by a thickness of 5 μm as illustrated in FIG. 2. The front end of the core conductor 7 projecting from the front end 3a of the receptacle 3, or the lower most end of the core conductive 7 as seen in FIG. 1, as well as the rear portion of the core conductor 7 leading to a control unit not shown in the drawings, is not coated with any such insulating layer, but coated with nickel and gold in that order, as required, for the purpose of maintaining a favorable electroconductivity in relation with other associated parts at all times.

A tubular guide member 9, consisting, for instance, of nickel silver (German silver), is fitted onto a free end portion of the needle member 6 over the resin layer 8, and is fixedly secured thereto with a bonding agent. This guide member 9 ensures the smooth movement of the needle member 6 in the front end 3a of the receptacle 3, and reinforces the needle member 6 against bending and buckling deformations of the front end portion of the needle member 6. The rear end of the needle member 6 extends out of the rear end 3b of the receptacle 3 shown in an upper part of FIG. 1, and is electrically connected to a control unit of a testing machine not shown in the drawings. The resin layer 8 extends a certain distance from the rear end of the receptacle 3.

A middle part of the receptacle 3, preferably adjacent the rear end of the receptacle 3, is provided with an engagement portion 11 consisting of an annular bead projecting radially and inwardly so as to define a constricted part in the inner bore of the receptacle 3. A compression coil spring 12 is coiled around the needle member 6, and is engaged between the annular engagement portion 11 and an annular shoulder surface defined by an upper edge 9a of the guide member 9. The end portion of the coil spring 12 engaging with the engagement portion 11 is provided with diameter portion 12a over a few turns of the coil wire. The outer diameter of the large diameter portion 12a in its free condition is slightly greater than the inner diameter of the internal bore of the receptacle 3.

Figure 3:
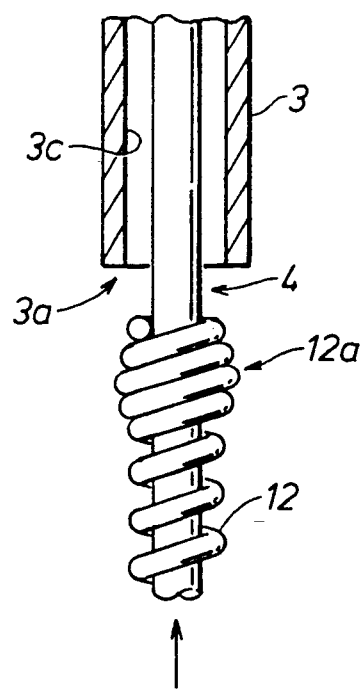
FIG. 3 is an enlarged view showing the manner in which the needle member is fitted into the receptacle.

Therefore, when assembling this contact probe 1, the compression coil spring 12 is wrapped around the needle member 6, and this needle member assembly is fitted into the receptacle 3 from the front end 3a or the lower end of the receptacle 3 as shown in FIG. 3. In this needle member assembly, the compression coil spring 12 may be retained between the mutually opposing shoulder surfaces of the wire coil or sleeve means 13 and the guide member 9 in a compressed state before inserting this needle member assembly into the receptacle 3 although the wire coil or sleeve means 13 is not shown in FIG. 3 to avoid crowding of the drawing. This assembly is forced into the receptacle 3 until the free end of the large diameter portion 12a of the coil spring 12 abuts the engagement portion 11. Since the outer diameter of the large diameter portion 12a in its free condition is slightly greater than the inner diameter of the internal bore of the receptacle 3, the assembly consisting of the needle member 6 and the coil spring 12 is securely retained in the receptacle.

A coil of wire or sleeve means 13 fixed to the needle member 6 over the resin layer 8 so as to extend between the interior of the receptacle 3 to the exterior of the receptacle 3 over the entire stroke L of the needle member 6. This stroke L, for instance, may be 3 mm. The wire coil 13 consists of a coarsely wound middle portion 13a, and two closely wound end portions 13b situated on either end of the wire coil 13. A small amount of an adhesive agent 14 is applied to the coarsely wound middle portion 13a to fixedly secure the wire coil 13 to the needle member 6. The closely wound portions 13b prevent the bonding agent 14 from seeping out of the wire coil 13b and thereby obstructing the proper functioning of the contact probe 1.

Alternatively, a sheet of thermoplastic resin may be wrapped around the needle member 6 prior to wrapping the wire coil 13 around the needle member 6 so as to be placed under the coarsely wound portion 13a, and melted by heating for securing the wire coil 13 around the needle member 6.

Since the wire coil 13 is wrapped around the needle member 6 over a length exceeding the stroke L of the needle member 6, the wire coil 13 can be always interposed between the rear end 3b of the receptacle 3 and the needle member 6, and prevents abrupt bending of the part of the needle member 6 near the rear end 3b of the receptacle 3. Further, the wire coil 13 protects the needle member 6 from being rubbed directly against the rear end 3b of the receptacle 3. The wire coil 13 is so flexible that it would not substantially impair the flexibility of the needle member 6.

FIG. 1 shows the contact probe 1 of the present invention before it is applied to an object to be tested. The needle member 6 is retained in the receptacle 3 by the large diameter portion 12a of the coil spring 12 elastically engaging with the inner surface 3c of the receptacle 3. Also, the inner or the lower end of the wire coil 13 abuts the outer or the upper end of the compression coil spring 12. Therefore, the compression coil spring 12 urges the needle member 6 out of the lower end of the receptacle 3, but the above mentioned engagement between the wire coil 13 and the compression coil spring 12 limits the movement of the needle member 6 out of the front end 3a of the receptacle 3.

Figure 4:
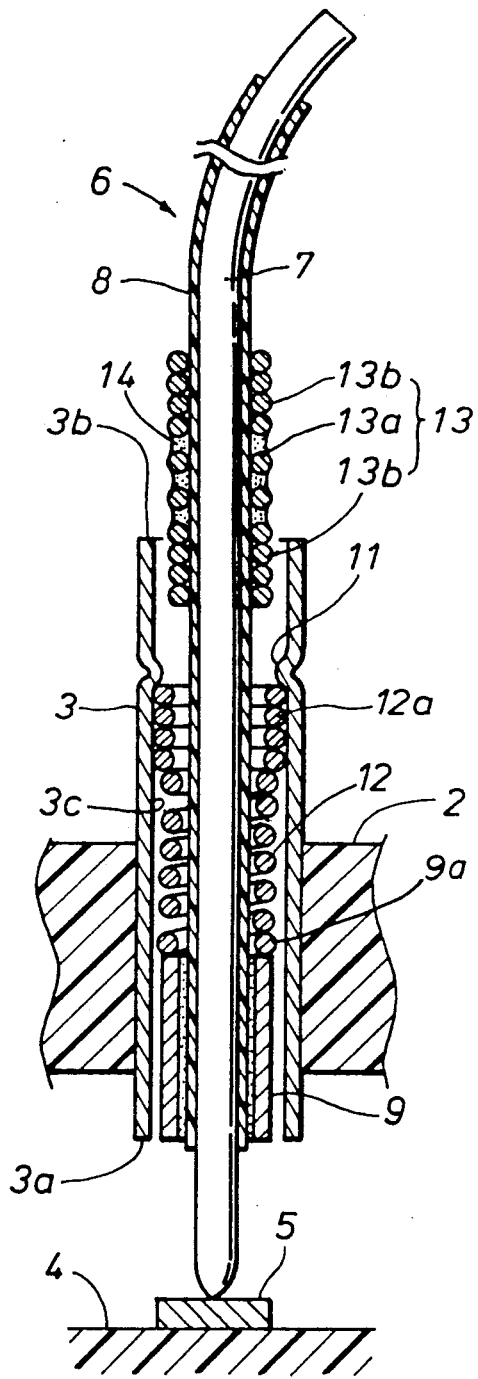
FIG. 4 is a view similar to FIG. 1 showing the contact probe when it is applied to a printed circuit board.

FIG. 4 shows the same contact probe 1 when its needle member 6 is applied to an object to be tested or the circuit pattern 5 formed on the printed circuit board 4. The compression coil spring 12 is compressed and produces a force necessary to urge the front end of the needle member 6 against the circuit pattern 5 and ensure a favorable electric contact therebetween. Since the circuit pattern 5 is electrically connected to the control unit of the testing machine by the integral needle member 6 without any break therein, the contact probe 1 achieves an extremely small electric resistance between the circuit pattern and the testing machine.

When the needle member 6 is required to be replaced for maintenance purpose, it can be easily done by pulling the needle member 6 out of the lower end of the receptacle 3 by a force sufficient to detach the larger diameter portion 12a from the inner surface 3c of the receptacle 3, and leaving the receptacle 3 still attached to the base plate 2. Since the receptacle 3 requires a relatively high positional accuracy, it is quite advantageous to be able to replace the needle member 6 without removing the receptacle 3 from the base plate 2.

Figure 5:
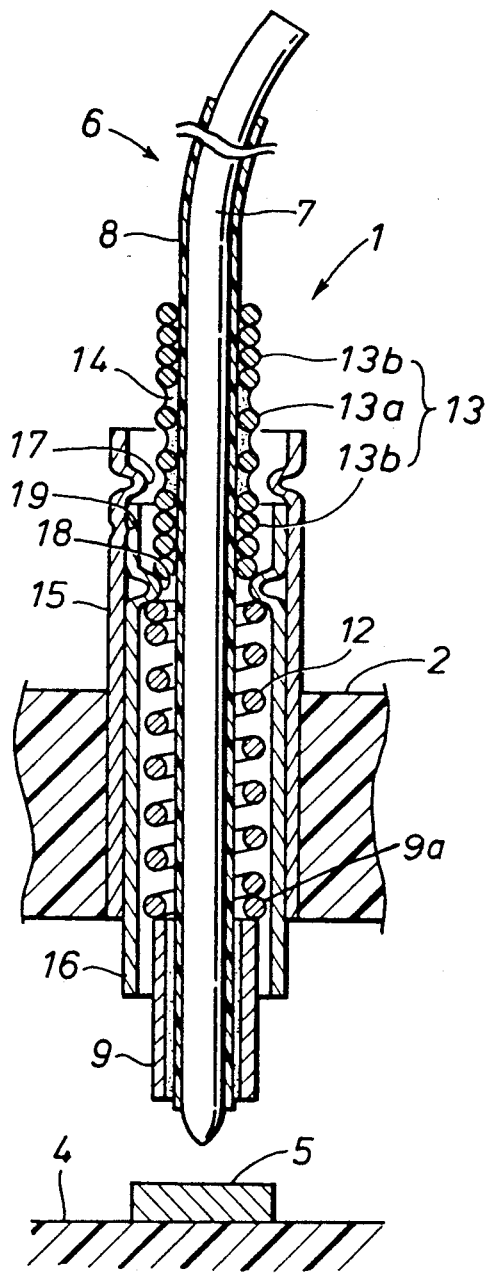
FIG. 5 is a view similar to FIG. 1 showing a second embodiment of the contact probe of the present invention.
Figure 6:
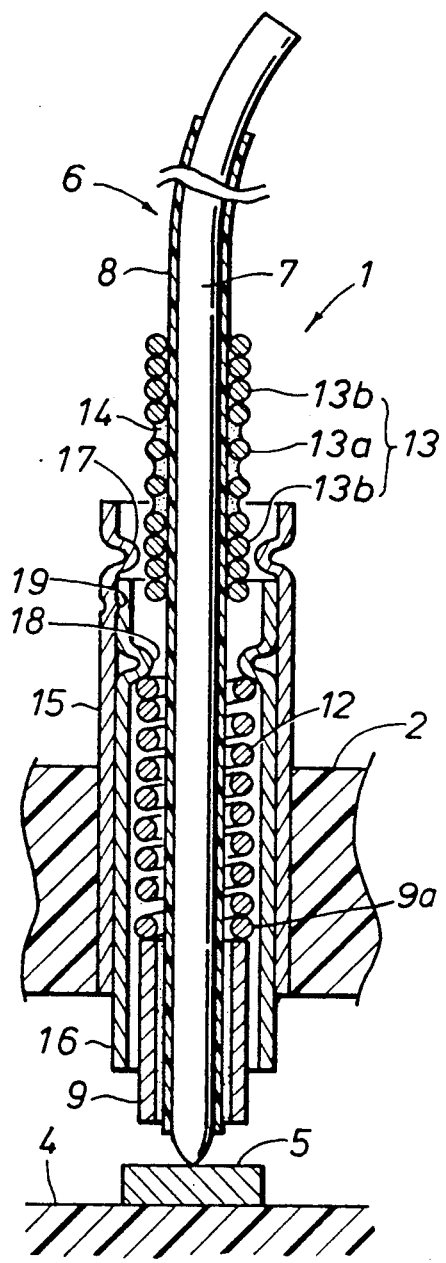
FIG. 6 is a view similar to FIG. 5 showing the contact probe when it is applied to a printed circuit board.

FIGS. 5 and 6 show a second embodiment of the present invention, and it should be noted that like numerals indicate like parts throughout the drawings.

In this embodiment, the receptacle receiving the needle member 6 consists of a double tubular structure consisting of an outer receptacle 15 passed through and fixedly secured to the base plate 2 in the same manner as the receptacle 3 was secured to the base plate 2 in the previous embodiment, and an inner receptacle 16 fitted into the inner bore of the outer receptacle 15 and fixedly secured thereto. The upper end of the inner receptacle 16 abuts an annular bead 17 projecting radially and inwardly from the outer receptacle 15, and the inner receptacle 16 is secured to the outer receptacle 15 by forming a projection 19 in the outer receptacle 15 by applying a localized pressure from the outer surface of the outer receptacle 15 and crimping it upon the inner receptacle 16.

The inner receptacle 16 is also provided with an annular bead 18 projecting radially and inwardly from the inner receptacle 16 in a part immediately below the crimped portion. The upper end of the compression coil spring 12 always abuts this annular bead 18, and the lower end of the wire coil 13 abuts this annular bead 18 when the needle member 6 is allowed to project from the front end of the inner receptacle 16 to the maximum extent. In the latter condition, the compression coil spring 12 is already compressed to a prescribed extent in the same way as in the previous embodiment.

In this case also, the wire coil 13, similar in structure to the wire coil 13 of the previous embodiment, effectively protects the needle member 6 near the rear end of the inner and the outer receptacles 15 and 16 against abrupt bending and the resulting excessive bending stress. In this case, each of the contact probes can be replaced as an assembly consisting of the needle member 6, the compression coil spring 12 and the inner receptacle 16.

Thus, according to this embodiment, since the wire coil 13 securely wrapped around the part of the needle member 12 which is required to be protected more than other parts thereof, the durability of the needle member can be substantially improved without increasing the size of the contact probe or substantially reducing the flexibility of the rear end of the needle member extending out of the rear end of the receptacle. And, the combination of the coarsely wound portion and the finely wound portions simplifies the assembly work, and improves the reliability of the contact probe.

Figure 8:
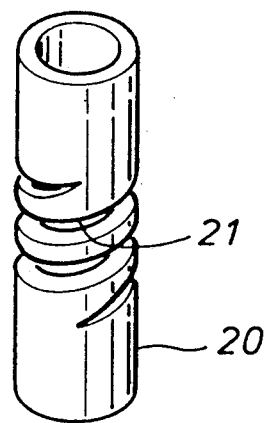
FIG. 8 is a perspective view of the sleeve member employed in the embodiment of FIG. 7.

FIGS. 7 through 9 show a third embodiment of the present invention in which a sleeve member 20 is fitted onto the needle member 6 at least over a length thereof which can be situated near the rear end 3b of the receptacle 3. This sleeve member 20 is provided with a spiral slit 21 extending at least a few turns around the sleeve member 20, and is axially stretched when it is fitted onto the needle member 6 so that a spiral gap may be defined by this spiral slit 21 in which a bonding agent 14 may be filled for securing the sleeve member 20 onto the needle member 6. The sleeve member 20 serves substantially the same functions as the wire coil 13 of the previous embodiment. The material of the sleeve member 20 may be metal, alloy or synthetic resin material which has a suitable flexibility and rigidity so that it may protect the needle member 6 against sharp bending and offer a shoulder surface abutting an end of the compression coil spring 12.

Figure 11:
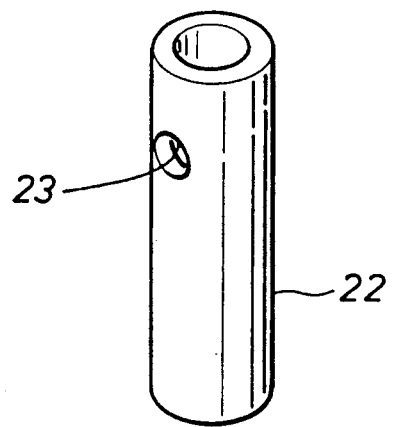
FIG. 11 is a perspective view of the sleeve member employed in the embodiment of FIG. 10.
Figure 10:
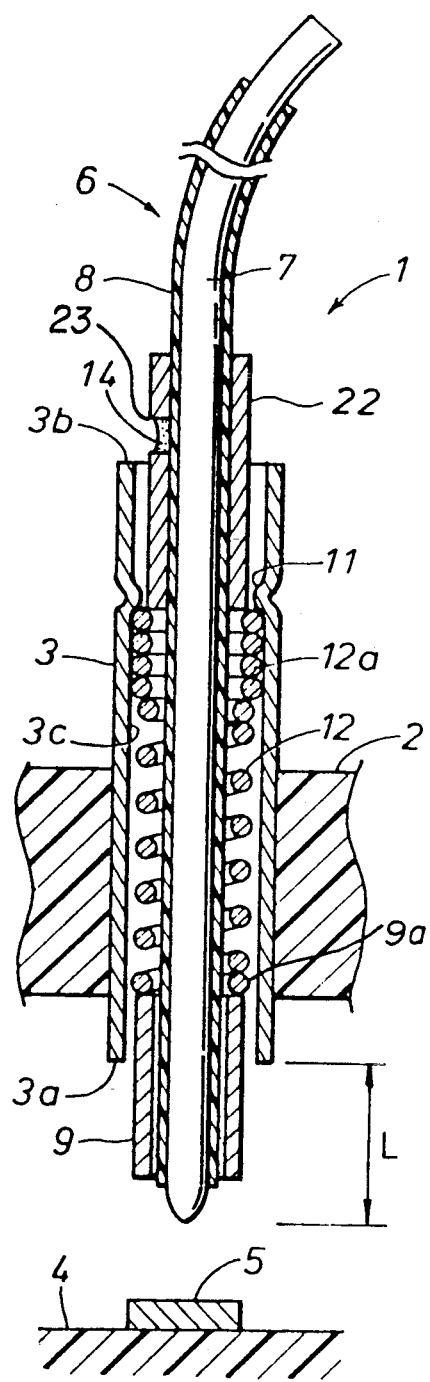
FIG. 10 is a view similar to FIG. 1 showing a fourth embodiment of the contact probe of the present invention.
Figure 12:
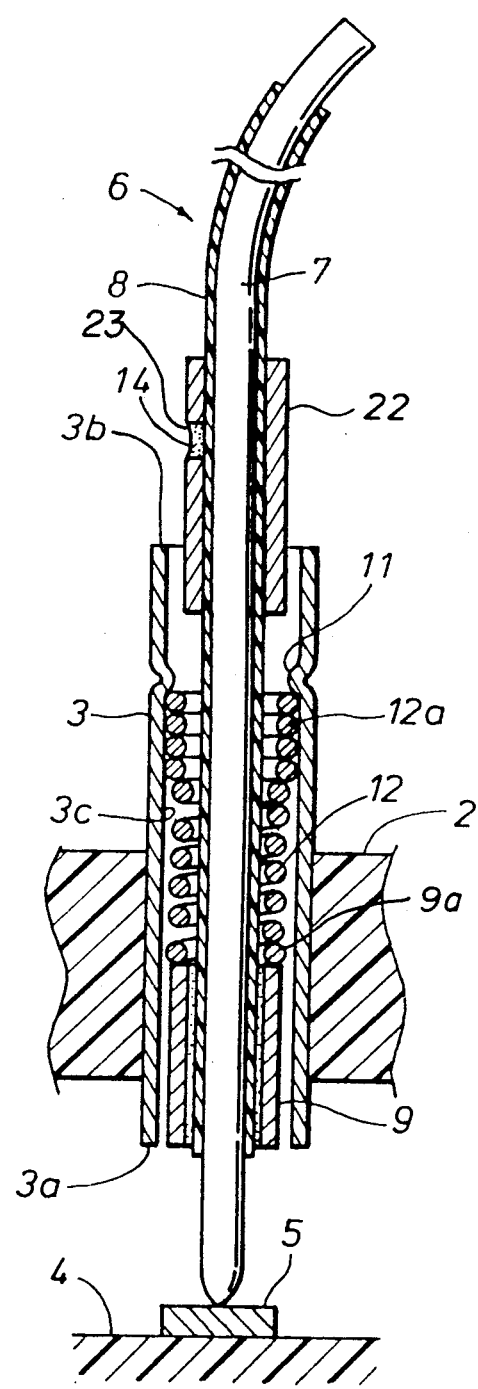
FIG. 12 is a view similar to FIG. 4 showing the fourth embodiment.

FIGS. 10 through 12 show a fourth embodiment of the present invention in which a sleeve member 22 is fitted onto the needle member 6 substantially in the same way as the sleeve member 22 was fitted onto the needle member 6 in the previous embodiment. This sleeve member 22 is provided with an opening 23 in which a bonding agent 14 may be filled for securing the sleeve member 22 onto the needle member 6. Otherwise, this sleeve member 22 is similar to the sleeve member 20.

Although the present invention has been described in terms of preferred embodiments thereof, it is obvious to a person skilled in the art that various alterations and modifications are possible without departing from the scope of the present invention which is set forth in the appended claims.

What we claim is:

1. A contact probe comprising:
   a tubular receptacle having a front end and a rear end, said tubular receptacle including a first shoulder surface at one end thereof;
   a needle member slideably received in said tubular receptacle, said needle member including a second shoulder surface at one end thereof;
   a compression coil spring coiled around said needle member, the ends of said coil spring respectively abutting said first and second shoulder surfaces at each end thereof, whereby said needle member is urged out of said front end of said tubular receptacle;
   means for limiting an extent of the movement of said needle member out of said front end of said tubular receptacle; and
   sleeve means secured to a part of said needle member which is adjacent said rear end of said receptacle, said sleeve means having at least a portion thereof disposed within said receptacle during an entire stroke of said needle member.

2. A contact probe according to claim 1, wherein said sleeve means consists of a wire coil securely wrapped around said needle member.

3. A contact probe according to claim 2, wherein said wire coil comprises a coarsely wound portion, a finely wound portion, and a bonding agent applied to said coarsely wound portion of said wire coil.

4. A contact probe according to claim 2, wherein said wire coil comprises a coarsely wound middle portion, a pair of finely wound portions provided on either end of said coarsely wound middle portion, and a bonding agent applied to said coarsely wound portion of said wire coil.

5. A contact probe according to claim 1, wherein said sleeve means consists of a sleeve member fitted onto said needle member.

6. A contact probe according to claim 5, wherein said sleeve member is provided with a spiral slit in which a bonding agent is filled to fixedly secure said sleeve member to said needle member.

7. A contact probe according to claim 5, wherein said sleeve member is provided with a side opening in which a bonding agent is filled to fixedly secure said sleeve member to said needle member.

8. A contact probe according to claim 1, wherein said means for limiting an extent of the movement of said needle member consists of an end of said sleeve means adjacent said compression coil spring abutting said annular shoulder surface defined in said receptacle.

9. A contact probe according to claim 8, wherein said annular shoulder surface defined in said receptacle consists of an annular bead projecting radially and inwardly from said receptacle.

10. A contact probe according to claim 1, wherein said needle member comprises a continuous conductor extending from a front end of said needle member over at least a certain distance out of said rear end of said receptacle.

11. A contact probe according to claim 10, wherein said needle member further comprises an insulating resin layer formed around said continuous conductor at least over a length thereof which can be situated inside said receptacle.

* * * * *